United States Patent [19]

Gonzales, Jr. et al.

[11] Patent Number: 5,163,232
[45] Date of Patent: Nov. 17, 1992

[54] SEMICONDUCTOR LEAD PLANARITY CHECKER

[75] Inventors: David Gonzales, Jr., Garland; Anthony M. Chiu, Richardson, both of Tex.

[73] Assignee: Texas Instruments Incorporated, Dallas, Tex.

[21] Appl. No.: 481,000

[22] Filed: Feb. 16, 1990

[51] Int. Cl.⁵ ............................ G01B 5/02; G01B 7/02
[52] U.S. Cl. ........................................ 33/533; 33/552; 33/557; 33/558; 33/DIG. 2; 33/1 BB; 340/653; 73/37.8
[58] Field of Search ................. 33/501, 533, 548, 549, 33/552, 555, 557, 558, DIG. 2, 340, 73, 1 BB; 340/653; 73/37.5, 37.8

[56] References Cited

U.S. PATENT DOCUMENTS

| | | | |
|---|---|---|---|
| 2,852,849 | 9/1958 | Groener | 33/DIG. 2 |
| 3,538,609 | 11/1970 | Minix | 33/DIG. 2 |
| 4,221,053 | 9/1980 | Bobel, II et al. | 33/DIG. 2 |
| 4,400,884 | 8/1983 | Baresh et al. | 33/552 |
| 4,754,555 | 7/1988 | Stillman | 33/533 |
| 4,774,768 | 10/1988 | Chiponis | 33/533 |

FOREIGN PATENT DOCUMENTS 216492  7/1957  Australia ..................... 33/DIG. 2

OTHER PUBLICATIONS

Bendix Automation & Measurement Division, "Sheffield Modular Precisionaire Gaging", Catalog No. Prec.-2102-1071, 1971.

Primary Examiner—Allan N. Shoap
Assistant Examiner—Alvin Wirthlin
Attorney, Agent, or Firm—Thomas R. Fitzgerald; B. Peter Barndt; Richard L. Donaldson

[57] ABSTRACT

The planarity of semiconductor device pins is measured simultaneously by multiple pneumatic comparator circuits by detecting pressure changes proportional to pin position.

17 Claims, 4 Drawing Sheets

SEMICONDUCTOR LEAD PLANARITY CHECKER

FIELD OF THE INVENTION

This invention relates to semiconductor devices, and more particularly to a system for checking lead planarity of semiconductor devices.

BACKGROUND OF THE INVENTION

In testing and mounting semiconductor devices, it is necessary that the leads of the device be correctly positioned and the ends of the leads lie in a common plane. The leads of the semiconductor device may be bent sideways, out, in or down moving the end of the pin from a plane common with the ends of the other pins.

Existing planarity inspection equipment is either not cost-effective or performs the inspection "off-line" as in a quality control operation. The hardware required for off-line inspection is inexpensive, however, the inspection is done manually, lead by lead, making 100% inspection time consuming as well as cost prohibitive. Automatic equipment which can be used for on-line inspection is actually stand-alone equipment integrated with the other processing equipment. Such equipment is typically visual/mechanical systems using laser or intelligent camera hardware, making such systems very expensive. The laser system is used to check device-to-circuit board solder joints instead of device lead planarity. There is presently no known system capable of on-line lead inspection and replanarization.

SUMMARY OF THE INVENTION

The principle of pressure changes produced by changes in exit orifice size in a continuous air flow system is applied to gauge semiconductor device lead planarity, and is particularly useful in PLCC (Plastic Leadless Chip Carrier) devices.

The system includes a pressure regulator, a filter, an air flow controller, a multiple port air manifold, and plurality of separate balanced pneumatic circuits leading to a gauging block. The number of pneumatic circuits depends upon the number of pins on the device to be tested.

The planarity checker system is a pneumatic system measuring pressure changes proportional to the lead position in reference to the device's bottom surface. Each lead position is measured by a balanced comparator circuit. The pressure changes are produced by restricting an orifice at the end of the measuring channel.

All lead position measurements are taken in parallel, and the device's lead plane is calculated automatically (through software) making the checker/planarizer a high throughput system.

Features of the system include on-line calibration and adjustable sensitivity, and a low-force replanarizing station which functions to rework devices not meeting specifications.

The system can be used for surface mount devices such as PLCC and SO devices, and also for DIP devices. DIP lead planarity and bent leads in both X and Y directions can be checked.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT OF THE INVENTION

Figure 1:
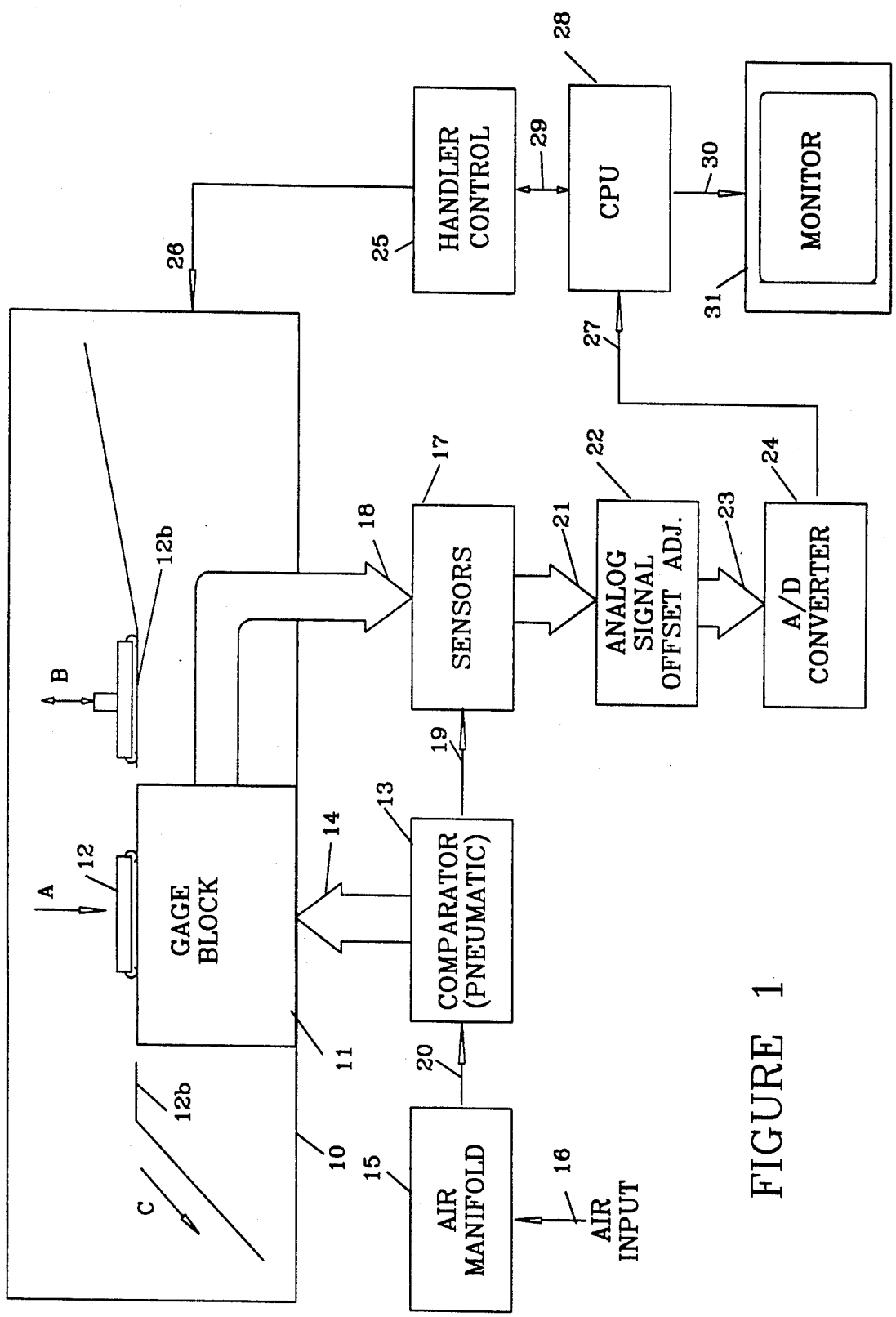
FIG. 1 is a block diagram of the invention.

FIG. 1 illustrates a block diagram of the system of the invention. Handler 10 includes a gauge block 11 on which semiconductor devices are tested to determine the planarity of the leads. The semiconductor device 12 is placed on the gauge block 11 and a pressure is applied at "A". If the device meets planarity specifications, it is move out of the handler system. If the pins are such that a correction can be made, then the semiconductor is moved to station 12a, the alignment and planarity of the pins is adjusted by applying pressure or bending out pins at "B", and the corrected device is rechecked, and if gauged "good" is moved out of the system. In the event the out of specification condition cannot be corrected at station 12a, then the device is move to station 12b and sent in a direction "C" to a rejected device bin.

The gauge block includes gauging pins, described below with references to FIGS. 3-5, which are pneumatically operated. Air is input at 16 to an air manifold 15. Air is distributed to a gauging device for each pin to be checked. Air from the manifold 15 is supplied via 20 to the comparator/sensor 17 which is connected to the gauging block via path 14. The sensors receive data from the gauge block via path 14. The sensed pneumatic data in block 17 is directed via path 21 to block 22 and is converted to analog electronic data in block 22, and then directed via path 23 and converted to digital data in the analog-to-digital converter 24. The digital data is then input via path 27 to the controller CPU 28. The controller feeds data back to the handler system 10 via 29, 25 and 26 to route the tested semiconductor device to the proper destination. A monitor 31 is connected to the Controller 28 by path 30 to provide visual test results.

Figure 2:
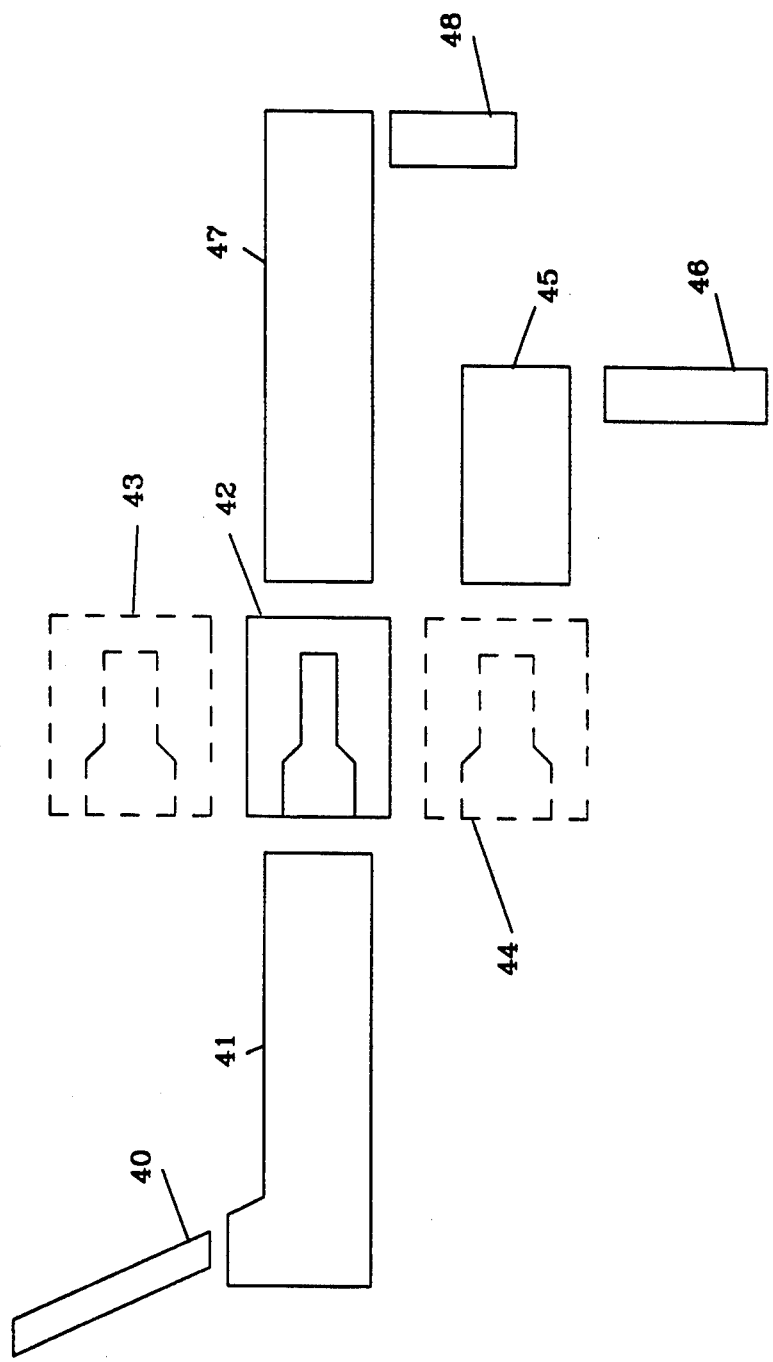
FIG. 2 is a simplified illustration of the device handler portion of the system.

FIG. 2 is a top view, simplified block diagram, of the handler system. Chute 40 introduces semiconductor devices to be tested onto track 41 which carries the semiconductor device to gauge block 42. The device is tested and, if the device meets specification, it is move via track 47 to storage bin 48. If the device can be reworked, it is move to rework station 43, rechecked, and then moved to storage bin 48. In the event, the device cannot be reworked, it is moved to station 44, and then moved via track 45 to bin 46.

Figure 3:
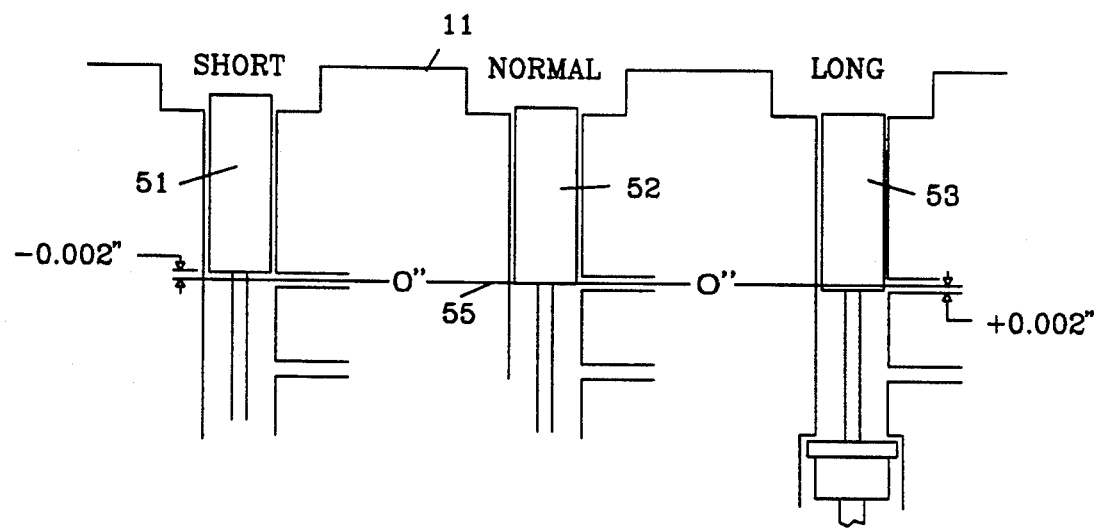
FIG. 3 illustrates three gauge stations showing three different pin positions.

FIG. 3 shows three gauge pins in gauge block 11 in three different positions. Pin 51 is positioned such as would occur when a pin on a semiconductor device is too short. Pin 52 is positioned such as would occur when a pin is of the correct length, and pin 53 is positioned such as would occur when a pin is too long. The 0" line 55 is the normal position of the bottom of the gauge pin when the pin on the semiconductor device is the correct length. When the device pin is short, the bottom of the gauge pin may be as much as 0.002" above the 0" line, and when the device pin is too long, it may be as much as 0.002" below the 0" line. The position of the bottom of the gauge pin is used to determine if a pin is correct, too long or too short.

Figure 4:
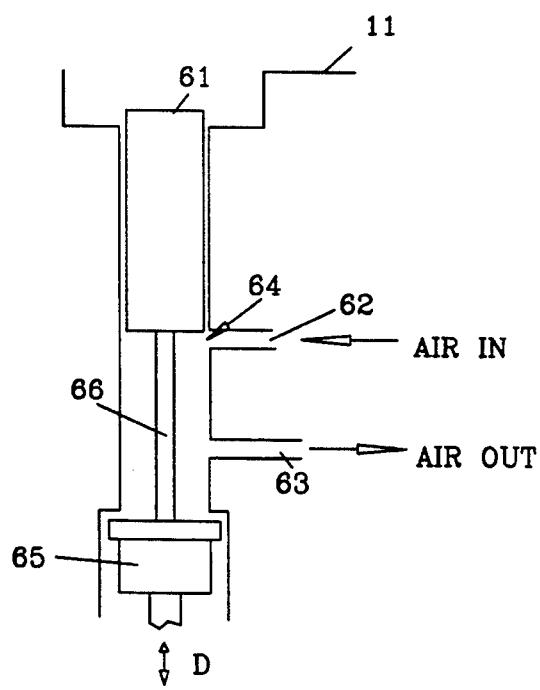
FIG. 4 illustrates a single pin gauge station.

FIG. 4 illustrates a single gauge pin, and illustrates the use of the pin position to measure the length of the device pin. Gauge pin 61, in gauge block 11 is in a normal position when the orifice indicated at 64 is fully open. Gauge pin 61 is connected to a pogo pin 65.

Pogo pin 65 is spring loaded, the spring is not illustrated, and moves up and down as indicated at "D". Air is introduced into inlet 62 and flows through opening 64 and out to the ambient through outlet 63. The back pressure at 64 varies with the position of the end of gauge pin 61, and the back pressure is measured and compared with a reference pressure to determine the position of the gauge pin. The position of the gauge pin is determined by the length of the device pin being measured.

Figure 5:
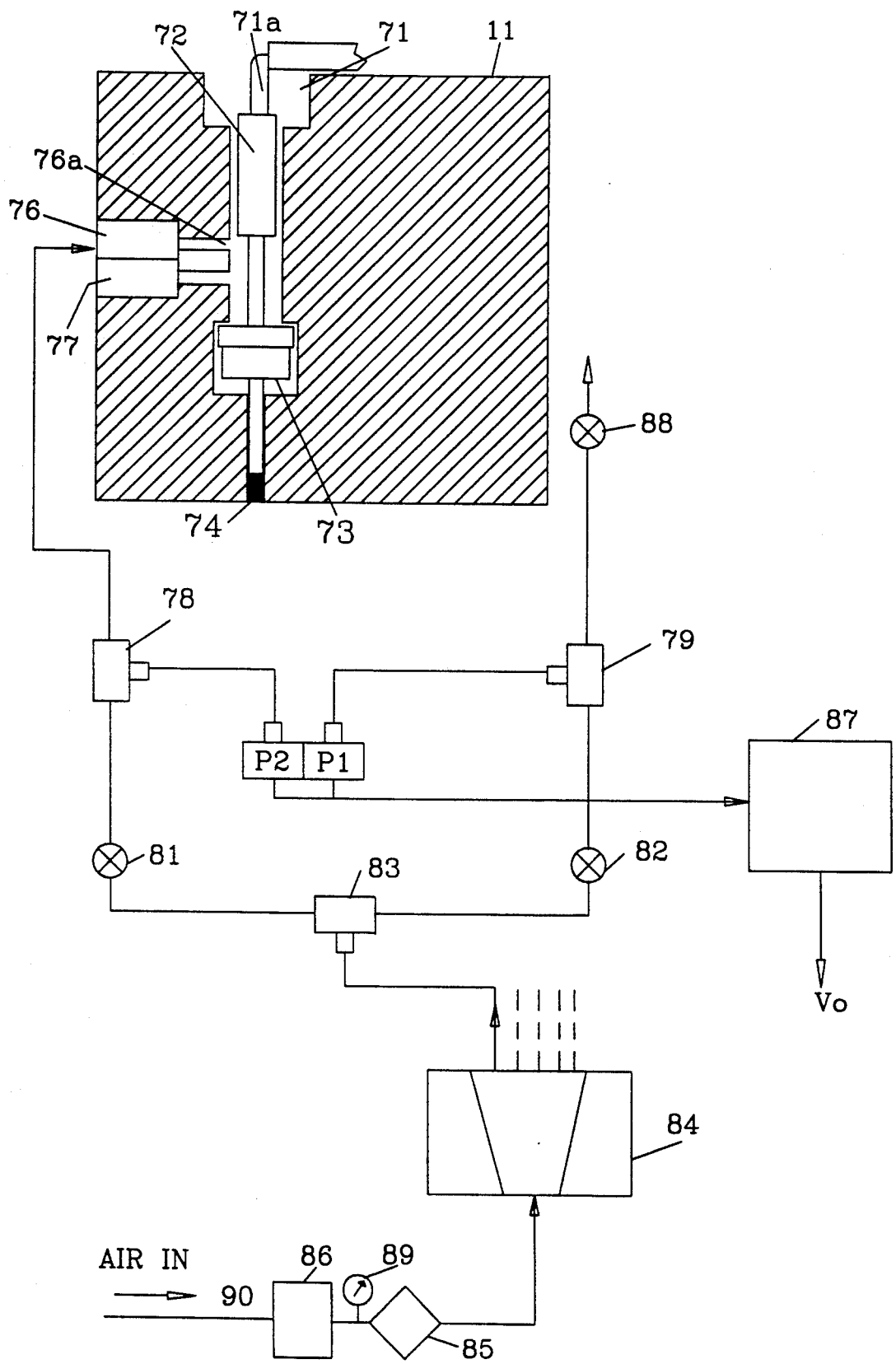
FIG. 5 is a simplified diagram of the gauging portion of the system.

FIG. 5 is a schematic diagram of the pneumatic/electronic gauging system. Gauge block 11 has device 71 positioned thereon such that pin 71a (other pins not illustrated) is contacting gauge pin 72. Gauge pin 72 is held upward via pogo pin 73 and spring 74, which is an integral part of pogo pin 73. A small load, for example 0.5 pound, is exerted on the top of device 71, at "E", to move device 71 against the top of the gauge block and to press downwardly with device pin 71a. Depending upon the length of device pin 71a, device pin 71a will move gauge pin 72 downward causing gauge pin 72 to at least partially close orifice 76a. Back pressure at gauge block inlet 76 will increase as gauge pin is move downwardly closing orifice 76a. Air input at inlet 76 is vented at outlet 77.

The circuit to measure the length of the device pin includes the following components and operates as follows.

Air is input to the gaging system at air input 90, and may be on the order of about 60 psi. The air flows though a pressure regulator 86 and an oil/particle filter 85. The air pressure is measure by air gauge 89. The air then flows into air manifold or air distributor 84. The air distributor distributes air of equal pressure to each device pin gauging station. There is one station for each pin of the device.

There are two air channels used for each pin measurement. One is the measuring channel, and the other is the reference channel.

Air from the manifold 84 is divided for each channel by air-T 83. Air flows through master setting restrictor 81 to air-T 78 to air input 76, and to side P2 of the differential pressure transducer 80.

Air also flows from air-T 83 to equalizing restrictor 82, air-T 79 and zero restrictor 88. Air flows form air-T 79 to side P1 of differential pressure transducer 80.

The output of differential pressure transducer 80 is connected to the Op Amp board 87 where an electronic signal is out put to the controller (See FIG. 1).

System operation is a follows. The planarity checker is made operational after setting regulated output (regulator 86) pressure from about 2.5 psi to 3.5 psi, as indicated by regulator gauge 89. The regulating characteristics of regulator 86 maintain a nearly constant pressure despite changes in inlet pressure and air flow requirements. After filtering oil, moisture, and any other contaminant from the air flow, the flow is directed to the manifold 84.

Manifold 84 distributes the flow to 18 separate lines (for an 18 pin device). Only one line is illustrated in FIG. 5. The flow in each line is split into two separate flows. The air in the reference channel flows through an equalizing jet 82, its pressure measured at port P1 of differential pressure traducer 80, and finally exits through a zero setting restrictor 88. The remaining air flow travels through master setting restrictor 81 and continues to the gauge block 11. At the gauging block, a restriction at 76a, depending upon the vertical position of gauge pin 72 cause a differential pressure between the two channels (measuring channel and reference channel). The change in pressure is a result of the change in the size of the opening at 76a, depending upon the vertical position of gauge pin 72. The vertical position of gauge pin 72 determines the restriction of opening 76a. It is the pressure differential that is the measure of the planarity of the leads. The voltage Vo is calibrated for a deflection of a desired amount. By measuring Vo, the amount of deflection is then determined. The device pin is then determined to be within or out of specification.

What is claimed:

1. A system for measuring the planarity of the ends of interconnection pins on semiconductor devices, comprising:
    a gauging block on which a semiconductor device is positioned;
    a plurality of gauge pins, one for each interconnection pin on the semiconductor device, the gauge pins being in contact with and deflected by the interconnection pins when the semiconductor device is on the gauging block;
    a plurality of pneumatic measuring circuits for measuring the deflection of, and producing data for each gauge pin; and
    reference circuits producing data against which the measuring circuit data is compared;
    wherein each gauge pin moves vertically in a cylindrical tube having an air input port and an air output port, the movement of the gauge pin, caused by deflection, moves the gauge pin across the air input port changing the back pressure at the air input port.

2. The system according to claim 1, wherein the gauge pins are spring loaded.

3. The system according to claim 1, wherein the reference circuits are pneumatic circuits.

4. The system according to claim 1, wherein the deflection of each gauge pin causes a change of air pressure in its respective measuring circuit.

5. The system, according to claim 4, wherein the change in air pressure in each measuring circuit is compared with a reference air pressure in a corresponding reference circuit, the difference in the measured air pressure and the reference air pressure being indicative of a deflection of the gauge pin corresponding to that measuring circuit.

6. The system according to claim 5, wherein the difference in measured air pressure and reference air pressure is translated into a voltage and compared against a calibrated voltage indicative of length of an interconnection pin.

7. The system according to claim 1, including an adjustment station for adjusting the length of the semiconductor device interconnection pin when the pin length is not correct.

8. A system for measuring the planarity of the ends of interconnection pins on semiconductor devices, comprising:

a gauging block on which a semiconductor device is position;

a plurality of gauge pins, one for each interconnection pin on the semiconductor device, the gauge pins being in contact with and deflected by the interconnection pins when the semiconductor device is on the gauging block;

a plurality of pneumatic measuring circuits for measuring the deflection of and producing data for each gauge pin; and a plurality of pneumatic reference circuits producing data against which each respective measuring circuit data is compared;

wherein each gauge pin moves vertically in a cylindrical tube having an air input port and an air output port, the movement of the gauge pin, caused by deflection, moves the gauge pin across the air input port changing the back pressure at the air input port.

9. The system according to claim 8, wherein the gauge pins are spring loaded.

10. The system according to claim 8, wherein the deflection of each gauge pin causes a change of air pressure in its respective measuring circuit.

11. The system, according to claim 10, wherein the change in air pressure in each measuring circuit is compared with a reference air pressure in a corresponding reference circuit, the difference in the measured air pressure and the reference air pressure being indicative of a deflection of the gauge pin corresponding to that measuring circuit.

12. The system according to claim 11, wherein the difference in measured air pressure and reference air pressure is translated into a voltage and compared against a calibrated voltage indicative of length of an interconnection pin.

13. The system according to claim 8, including an adjustment station for adjusting the length of the semiconductor device interconnection pin when the pin length is not correct.

14. A method for measuring the planarity of the ends of interconnection pins on semiconductor devices when the semiconductor device is placed in a gauging block having gauge pins therein, there being one gauge pin for each interconnection pin on the semiconductor device, comprising the steps of:

pressing the semiconductor device onto the gauging block causing the gauge pins to be deflected vertically in a cylindrical tube having an air input port and an air output port;

measuring pneumatically the back pressure of the air input port to determine the amount of deflection for each interconnection pin;

comparing the amount of deflection of each gauge pin against a pneumatic standard reference; and determining the length of each interconnection pin based on the comparison against the pneumatic standard reference.

15. The method according to claim 14, wherein the step of measuring the amount of deflection is done pneumatically and the step of comparing the amount of deflection is done electronically.

16. The method according to claim 15, including the step of translating the results of pneumatic measuring to an electrical value.

17. The method according to claim 14, including the step of adjusting the length of each interconnection pin that is not the correct length.

* * * * *